(12) United States Patent
Antonini et al.

(10) Patent No.: US 8,660,187 B2
(45) Date of Patent: Feb. 25, 2014

(54) METHOD FOR TREATING DIGITAL DATA

(75) Inventors: Marc Antonini, Nice (FR); Leonardo Hidd Fonteles, Nice (FR)

(73) Assignees: Centre National de la Recherche Scientifique (CNRS), Paris (FR); Universite de Nice Sophia Antipolis, Nice (FR)

( * ) Notice: Subject to any disclaimer, the term of this patent is extended or adjusted under 35 U.S.C. 154(b) by 415 days.

(21) Appl. No.: 12/995,530

(22) PCT Filed: May 27, 2009

(86) PCT No.: PCT/FR2009/000616
§ 371 (c)(1),
(2), (4) Date: Jun. 9, 2011

(87) PCT Pub. No.: WO2009/156605
PCT Pub. Date: Dec. 30, 2009

(65) Prior Publication Data
US 2011/0235719 A1 Sep. 29, 2011

(30) Foreign Application Priority Data

Jun. 2, 2008 (FR) .................................. 08 03017

(51) Int. Cl.
*H04N 7/28* (2006.01)
(52) U.S. Cl.
USPC .................................................. 375/240.22
(58) Field of Classification Search
USPC .................................................. 375/240.22
IPC .................................................. H04N 7/28
See application file for complete search history.

(56) References Cited

U.S. PATENT DOCUMENTS

| 7,106,228 B2 | 9/2006 | Bessette et al. |
| 2004/0208244 A1 | 10/2004 | Barlaud et al. |
| 2005/0285764 A1 | 12/2005 | Bessette et al. |

FOREIGN PATENT DOCUMENTS

| WO | WO 99/33185 | 7/1999 |
| WO | WO 00/78052 | 12/2000 |
| WO | WO 03/103151 | 12/2003 |
| WO | WO 2008/104725 | 9/2008 |
| WO | WO 2009/156606 | 12/2009 |
| WO | WO 2010/001020 | 1/2010 |

OTHER PUBLICATIONS

Fonteles, Leonardo Hidd, and Marc Antonini. "Indexing $Z^n$ Lattice Vectors for Generalized Gaussian Distributions." Information Theory, 2007. ISIT 2007. IEEE International Symposium on. IEEE, 2007.*
Loyer, Pierre et al.; "Lattice Codebook Enumeration for Generalized Gaussian Source;" IEEE Transactions on Information Theory, vol. 49, No. 2, XP011074685, Feb. 1, 2003; pp. 521-528.

* cited by examiner

*Primary Examiner* — Jay Patel
*Assistant Examiner* — Neil Mikeska
(74) *Attorney, Agent, or Firm* — Harness, Dickey & Pierce, P.L.C.

(57) ABSTRACT

The disclosure relates to a method for treating digital data, including a quantification step of calculating, in a space of dimension d, at least one vector index $I_1$ for at least some of the vectors 1, the vectors 1 forming input data descriptors. The method is characterized in that the vector index $I_1$ corresponds to the number of vectors preceding the vector 1 in the reverse lexicographic order, without involving a step of determining all of the vectors.

10 Claims, 2 Drawing Sheets

METHOD FOR TREATING DIGITAL DATA

CROSS-REFERENCE TO RELATED APPLICATIONS

This application is a National Phase Entry of International Application No. PCT/FR2009/000616, filed on May 27, 2009, which claims priority to French Application Serial No. 08/03017, filed on Jun. 2, 2008, both of which are incorporated by reference herein.

BACKGROUND AND SUMMARY

The present invention concerns the field of the processing of digital data with a view to applications such as the compression of digital data, the search for digital data, the comparison of digital data or the decompression of digital data. The invention concerns the processing of audiovisual data, and more generally any type of digital data. The aim of the invention is to reduce the processing time and the computing resource requirements with regard to both the computing power and the memory requirements.

The applications concern in particular but not exclusively the processing of images requiring a very large number of data to describe them. To reduce the transmission time and the size required for storage, the information is compressed by extracting the visual information that alone will be coded. This coded information must be located in an optimum fashion in terms of frequency and in space to allow optimum reproduction while avoiding any redundancy detrimental to the performance of the coding. For this purpose, using the wavelet transform technique is known, the coordinates of which constitute a vector lattice that is then subjected to a vector quantisation step.

The principle of vector quantisation (VQ) is to code a sequence of samples forming a vector instead of coding each of the samples individually. The coding is done by approximating the sequence to be coded by a vector belonging to a catalogue of forms usually referred to as a "codebook". Each of the vectors of the catalogue of forms is indexed. During coding, it is the index of the vector closest to the sequence of samples to be coded that will be used to represent it.

The known solutions require the determination of each of the vectors, recording thereof in a memory and then execution of processing on all the vectors in order to count them. The vector base may require several gigabytes and the computing times for such a large base are lengthy. The aim of the invention is to propose a counting and indexing method avoiding these drawbacks. A quantisation method is known from article [1]. A lattice is a set of vectors in a space with dimension n forming an additive group, in the mathematical sense of the term. The book [2] describes such lattices in detail. International Patent Application WO9933185 is known in the prior art, concerning a coding method consisting of determining a vector, referred to as the leader, which comprises the same components as the quantised vector but in a predetermined order, and then determining the level or rank of the quantised vector in the formed set of vectors that have the same components as the leader and are, in the set, ordered in a predetermined manner. The method then consists in forming a code from firstly an index representing the leader thus determined and secondly the rank.

The main difficulty encountered for designing an algebraic vector quantiser for the compression is related to the problem of counting and indexing vectors in the regular lattice of points (which constitutes the quantisation dictionary). We present here the solutions that we have proposed for solving these problems in the case of a generalised Gaussian distribution source (such as for example the wavelet coefficients).

Algebraic Vector Quantisation

Quantisation has been studied for a few decades now and the work done has developed numerous results that are today conventional on the rate/distortion theory. In particular, it has been shown that vector quantisation (VQ) has numerous advantages compared with scalar quantisation (SQ) when fixed-length coding is required. In addition, the work by Shannon has shown that the performances of VQ are close to the optimum theoretical performances if the dimension n of the quantisation vectors is sufficiently large.

However, it is important to note that VQ may approach these optimum performances at the cost of a high computing complexity; a complexity that increases exponentially with the dimension of the vectors. Generally, VQ is performed using a non-structured dictionary constructed from statistical data representing the source (learning sequence). In this case, the complexity and the storage requirements due to the size of the dictionary may become prohibitive for compression applications. In addition, there exists a problem of robustness of the dictionary which, optimised for a given learning sequence, gives poor performance for an image outside the learning sequence. One solution for overcoming these problems is to use an n-dimensional structured VQ such as algebraic vector quantisation (AVQ) or vector quantisation on regular lattices of points.

As the vectors of the dictionary are forced to belong to a structured regular lattice, the performances of AVQ are in general inferior to those of non-structured VQ. However, in the majority of applications, this slight disadvantage is compensated for by the fact that, for AVQ, no dictionary needs to be generated or stored, and the coding complexity is reduced.

Quantisation by regular lattices of points may be seen as an extension of uniform scalar quantisation. As in the case of non-structured VQ, the term AVQ will be used in the rest of the document either to designate vector quantisation or to designate a vector quantiser. AVQ takes into account the spatial dependencies between the coefficients of the vectors and the gains in partitioning and form. Whatever the distribution of the source, AVQ is always more effective than SQ.

A regular lattice of points in $R^n$ is composed of all the possible combinations of a set of linearly independent vectors $a_i$ that constitutes the base of the lattice $\{y|y=u_1a_1+u_2a_2+\ldots+u_na_n\}$ where the coefficients $u_i$ are integers. The partitioning of the space is then regular and depends only on the base vectors chosen. Each base defines a regular lattice of different points. AVQ offers the possibility of considerably reducing the computing and storage costs compared with a VQ design by means of algorithms based on the generalised Lloyd algorithm. Indeed, using the vectors of a regular lattice as quantisation values eliminates the operation of constructing a dictionary: the dictionary is constructed implicitly through the structure of the selected lattice. The article [1] describes fast quantisation algorithms that simply use counting operations and depend only on the dimension n of the vectors. In 1979, Gersho made the conjecture that, in the asymptotic case (that is to say for high rates), the rate/distortion performances of an AVQ are approximately optimum. However, although the AVQ is not mathematically optimum for low rates, the reduction in complexity afforded by such quantisers makes it possible to use large dimensions of vectors, which gives rise to better experimental performances for a given rate. Good rate/distortion performance can be obtained by combining AVQ with an entropic coder, which motivated a few works on AVQ in the field of wavelets. Many theoretical works on VQ have been carried out for Gaussian and Laplacian sources. Furthermore, in the case of generalised Gaussian sources with a decrease parameter of less than one, it was shown that the cubic lattice $Z^n$ was better in terms of rate/distortion than the lattice $E_8$ and the Leech lattice. This result spurred on our work to combine AVQ with wavelet transform.

The Problems Dealt with by the Invention

Though quantisation by AVQ is not very complex, because of the regular geometric structure of the dictionary, implementation thereof is however not immediate. In the case of non-asymptotic models, the overload noise is ignored since we assume the use of a variable-length coding and an infinite dictionary. It raises in fact a certain number of concrete questions, in particular in terms of computing and storage. Two fundamental problems can be put forward in the design of an AVQ:

a) Indexing: Indexing is an operation independent of quantisation. It consists in assigning to each quantised vector an index that, once coded, is transmitted over a channel to the decoder. This operation is fundamental in the compression chain. It determines in fact the bit rate and enables vectors to be decoded without ambiguity. The known methods are generally very inexpensive in terms of memory but have a not insignificant computing complexity (recursive algorithms) or function only in particular cases (types of lattice or particular truncation). The invention concerns a more general approach that allows indexing on distributions of the generalised Gaussian type, giving rise to a good compromise between memory cost and computing cost.

b) Counting. The indexing methods are generally based on knowledge of the population of the lattice. Thus we must be capable of counting the vectors in the lattice on n-dimensional surfaces (or within n-dimensional volumes) that depend on the distribution of the source. A conventional counting approach is based on the use of generating series. In this formalism, the functions Nu have been introduced. They allow counting on pyramids, that is to say in the case of a Laplacian distribution. We have proposed a more general approach that allows counting on distributions of the generalised Gaussian type, giving rise to a good compromise between memory cost and computing cost. The second patent proposes a solution to this problem.

Object of the Invention

The purpose of the invention is to propose a processing method including a step of vector quantisation that can be performed using limited computing resources in terms of storage memory as well as processing time. The present invention relates, for this purpose, according to its broadest sense, to a method for processing digital data comprising a quantisation step which consists in calculating in a space with dimension d at least one leader index $I_1$ for at least one part of the vectors I, the vectors I constituting descriptors of input data, the method including the leader index $I_1$ corresponds to the number of vectors that precede the leader I in reverse lexicographical order without the step of determining all the leaders. The processing method preferably does not include any steps of determining leaders other than the leader I currently being calculated.

Advantageously, the step of calculating the norm $I_p$ of the leader I comprises a step of calculating the norm at $r_8{}^p{}_d$ of the leader $I(x_1, x_2, \ldots, x_d)$, where $x_1$ to $x_d$ are sorted in increasing order, $r_8{}^p{}_d$ being equal to the sum of the results of the function $T(x_i)$ for a value of i ranging from 1 to d, the function $T(x_i)$ returning the result of dividing the coordinate $x_i$ raised to the power p by a precision factor delta, the result of the division being rounded to the nearest integer. In a specific variation, the step of calculating the leader index $I_1$ comprises a step of calculating the norm $r^p{}_{delta,d}$ of the leader $I(x_1, x_2, \ldots x_d)$, where $x_1$ to $x_d$ are sorted in increasing order, and recursive counting steps on the coordinates $x_i$ with the value of i ranging from d to 1, the counting steps consisting in counting the vectors in which the coordinate $x_i$ is comprised between $x_{i+1}$ and $MIN(x_{i+1}, r_8{}^p{}_d))$, the index 1, being equal to the sum of the results of the counting steps, F(A) being a function that returns an integer value w in which the value T(w) is lower than or equal to the argument A of the function F.

In another variation, the step of calculating the leader index $I_1$ comprises a step of calculating the norm $r_8{}^p{}_d$ of the] leader $I(x_1, x_2, \ldots x_d)$, where $x_1$ to $x_d$ are sorted in decreasing order, and recursive counting steps on the coordinates $x_i$ with the value of i ranging from 1 to d, the counting steps consisting in counting the vectors in which the coordinate $x_i$ is comprised between $x_{i+1}$ and $MIN(x_{i-1}, F(r_8{}^p{}_d))$, the index $I_l$ being equal to the sum of the results of the counting steps, F(A) being a function that returns an integer value w in which the value T(w) is lower than or equal to the argument A of the function F. According to another variation, the step of calculating the leader index $I_1$ comprises a step of calculating the norm r of the leader $I(x_1, x_2, \ldots x_d)$, where $x_1$ to $x_d$ are sorted in increasing order, and recursive counting steps on the coordinates $x_i$ with the value of i ranging from d to 1, the counting steps consisting in counting the vectors in which the coordinate $x_i$ is comprised between $x_{i+1}$ and $MIN(x_{i+1}, r-x_{i+1})$, the index $I_l$ being equal to the sum of the results of the counting steps. According to another variation, the step of calculating the leader index $I_1$ comprises a step of calculating the norm r of the leader $I(x_1, x_2, \ldots x_d)$, where $x_1$ to $x_d$ are sorted in decreasing order, and recursive counting steps on the coordinates $x_i$ with the value of i ranging from 1 to d, the counting steps consisting in counting the vectors in which the coordinate $x_i$ is comprised between $x_i+1$ and $MIN(x_{i-1}, r-x_{i-1})$, the index $I_l$ being equal to the sum of the results of the counting steps.

The invention also relates to the application of the methods for the compression of vector data consisting in recording the result of binary coding of the index $I_l$ as well as at least a sign index $I_s$, a norm index $I_n$ and a permutation index $I_p$. The vector data include:
digital images,
digital video sequences,
digital audio data,
digital three-dimensional objects,
digital animated three-dimensional objects,
information stored in a database,
coefficients from the transformation of the]] vector data (e.g.: DCT coefficients, wavelet coefficients, etc.). The invention also relates to the application of the methods for searching in a vector database consisting in calculating for reference information an index $I_{n,ref}$ as well as at least a sign index $I_{s,ref}$, a norm index $I_{n,ref}$ and a permutation index $I_{p,ref}$ and in searching for the data associated with the same indices.

The vector data include:
digital images,
digital video sequences,
digital audio data,
digital three-dimensional objects,
digital animated three-dimensional objects,
objects of a text database,
coefficients from the transformation of the vector data (e.g.: DCT coefficients, wavelet coefficients, etc.).

The invention also relates to a method for reconstructing a digital datum from the leader index $I_1$ calculated according to an aforementioned method, wherein it comprises calculating the coordinates $(x_1, x_2, \ldots, x_d)$ of a leader I and it comprises applying to an index $I_1$ a treatment which involves finding the leader I with the index $I_1$ which corresponds to the same number of vectors preceding the leader I in reverse lexicographical order without the step of determining all the leaders. Preferably, a recursive treatment is performed on the variable i ranging from d to 1, the treatment being applied to the coordinate $x_i$ with $x_i$ ranging from MIN $(x_{i+1}, F(r^P_{\delta,i}))$ to 0 and consisting in adding the results of the counting steps by means of applying the function $F(A)$, until the sum is greater than the index $I_1$, the sought coordinate $x_i$ being that which leads to the]] index $I_1$ being surpassed, the method then consisting in continuing, for the coordinate $X_{i-1}$ the sum from the value $I_1'$, in which $I_1'$ is the value preceding the value $I_1$ prior to surpassing the index.

Advantageously, a recursive treatment is performed on the variable i ranging from 1 to d, the treatment being applied to the coordinate $x_i$ with $x_i$ ranging from MIN$(x_{i-1}, F(r^P_{\delta,i}))$ to 0 and consisting in adding the results of the counting steps by means of applying the function $F(A)$, until the sum is greater than the index $I_1$, the sought coordinate $x_i$ being that which leads to the index $I_1$ being surpassed, the method then consisting in continuing, for the coordinate $X_{i+1}$ the sum from the value $I_1'$, in which $I_1'$ is the value preceding the value $I_1$ prior to surpassing the index. By convention, $x_{d+1}$ is the highest integer allowed according to the precision of the processor, or at least higher than $F(r^P_{\delta,d})$. For reconstruction, $I_1=0$ for processing the coordinate $x_d$ when sorted in increasing order, and the coordinate $x_1$ when sorted in decreasing order.

BRIEF DESCRIPTION OF THE DRAWINGS

The invention will be better understood from a reading of a non-imitative example embodiment, referring to the accompanying drawings, where.

DETAILED DESCRIPTION

Figure 1:
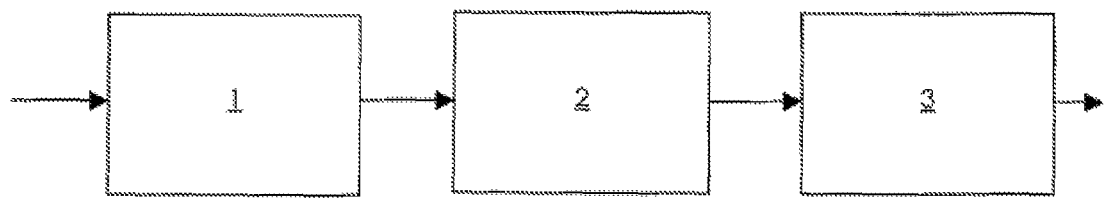
FIG. 1 shows the block diagram of a data processing system according to the invention.

A data processing system commonly comprises three main modules. A first module (1) receives the input data, for example a digital signal corresponding to an image, and uses this sampled signal to calculate a wavelet transform using known techniques. The quantisation module (2) codes the wavelet coefficients, by a vector quantisation and indexing method of the wavelet coefficients implementing the method according to the invention. The third module performs the coding required to reduce the size of the information stored or sent, by known methods of loss-free compression.

The quantisation and indexing step performed by the second module (2) is more specifically the object of the invention. This step requires a lot of resources in the solutions of the prior art, which involve determining all the leader vectors and thus at least temporarily storing them in memory.

A vector quantisation method on a lattice is known and generally used in systems for compressing audio, video and multimedia signals in general. Lattice vector quantisation is the multidimensional extension of uniform scalar quantisation. The latter consists in separately quantising a signal, for example representing each pixel of an image, in $2^N$ levels, where N is the number of bits allocated to the quantiser. As for lattice vector quantisation, it is associated with a regular lattice and makes it possible to determine a quantisation vector, or quantised vector, belonging to the lattice in question in which the components represent the values assumed by the signals to be coded. More specifically, the quantisation operation therefore consists in determining, according to an original vector in which each one of the components represents the value assumed by a signal to be coded and therefore belongs to an uncountable set, such as the set of real numbers R, a quantised vector x in which each one of the components belongs to a countable set such as the set of relative numbers Z.

The indexing of lattice vectors is an essential problem in lattice quantisation applications. The invention concerns a solution to this problem using the lattice leader vectors and the context of the theory of partitions. It functions for generalised Gaussian distribution sources and allows the use of product codes. It also makes it possible to index vectors of a high dimension.

Vector quantisation (VQ) could make it possible to obtain optimum theoretical performance if the vectorial dimension is arbitrarily high. Unfortunately, the computing complexity of optimum non-structured VQ, such as LBG, increases exponentially with the dimension. In addition, the storage requirements may be very great. One solution to this problem of dimensionality is the use of constrained VQ such as lattice vector quantisation (LVQ).

The LVQ approach leads to the design of a structured dictionary the code vectors of which are regularly distributed in space. Consequently, instead of optimising the position of the vectors in space, it is possible to adapt the source by indexing the lattice vectors in accordance with the form of its distribution. For the majority of real data sources this may be done effectively by using a product code, leading to an optimum rate/distortion compromise for symmetrical unimodal source distributions. This is because it is possible to interpret such distributions as being a set of concentric hypersurfaces having the same form according to the source distribution. It is then possible to index the lattice codewords by assigning a first index (prefix) corresponding to the norm (radius) of the respective surface and a second single index (suffix) corresponding to the counting of the vectors belonging to the same surface.

A large number of important data sources, such as sub-band speech and image coefficients, in particular those obtained by wavelet transformation, can be modelled by generalised Gaussian distributions. This family of distributions is parameterised by a unique shape factor p (GG(p)) for a univariate stochastic variable. An interesting property of the sources having distributions (GG(p)) is that the envelopes of norm $I_p$ correspond to constant probability surfaces. This leads to the development of effective product codes.

Even if the calculation of the prefix is trivial, the suffix requires the counting and indexing of the lattice vectors situated on given hypersurfaces. In addition, the increase in the dimension of the space may make the indexing operation very complex, given that the number of vectors situated on an envelope greatly increases with the norm, as illustrated by the following table, showing the comparison of the number of leaders of a given hyperpyramid and the total number of lattice leaders situated on this hyperpyramid (cardinality) in the case of a norm for a lattice $Z^n$ and different dimension and norm values.

| Dimension | Norm | Number of leaders | Cardinality |
|---|---|---|---|
| 3 | 10 | 13 | 402 |
|  | 400 | 884 | 640002 |
|  | 1000 | 83834 | 4000002 |
| 9 | 10 | 41 | 1854882 |
|  | 172 | $1.37 \cdot 10^8$ | $9.74 \cdot 10^n$ |
|  | 1842 | $9.98 \cdot 10^{15}$ | $1.68 \cdot 10^{24}$ |
| 18 | 10 | 42 | 317222212 |
|  | 29 | 4426 | $8.42 \cdot 10^n$ |
|  | 450 | $9.89 \cdot 10^{15}$ | $9.39 \cdot 10^n$ |
| 60 | 5 | 7 | 207648024 |
|  | 11 | 56 | $1.90 \cdot 10^n$ |
|  | 303 | $9.88 \cdot 10^{15}$ | $2.54 \cdot 10^n$ |
| 120 | 4 | 5 | 138259200 |
|  | 9 | 30 | $7.30 \cdot 10^n$ |
|  | 301 | $9.92 \cdot 10^{15}$ | $9.50 \cdot 10^{34}$ |
| 240 | 3 | 3 | 18432160 |
|  | 7 | 15 | $1.17 \cdot 10^{15}$ |
|  | 301 | $9.93 \cdot 10^{15}$ | $1.68 \cdot 10^{203}$ |

In the literature, the indexing of the suffix is generally performed according to two different techniques. The first attributes an index taking account of the total number of vectors situated on a given hypersurface (cardinality). Another approach exploits the symmetries of a lattice using the concept of leaders. The leaders of an envelope of norm $I_p$ correspond to a few lattice vectors from which all the other lattice vectors situated on the corresponding envelope can be obtained by permutations and changes of sign of their coordinates. These two approaches have a tendency to have similar rate/distortion performances for isotropic sources.

However, the majority of works on lattice indexing propose solutions solely for Laplacian or Gaussian distributions, which are particular cases of GG(p), with shape parameters p=1 and p=2, respectively. A few authors propose a solution for the particular case p=0.5. However, this counting method does not enable product codes to be constructed and the indexing method is very complex in practice, in particular for p≠0.5, 1 or 2 with high dimensions and norms.

The invention proposes a novel alternative for indexing lattice vectors $Z^n$ situated on envelopes GG(p) with 0<p≤2. The proposed solution is based on vectors and uses the theory of partitions. The use of the theory of partitions has enabled us to overcome the complexity and the storage requirements in order to generate and index the leaders. We propose an economic indexing algorithm which attributes the suffix index on the fly without using conversion tables.

In the following description, a first part presents the principle of LVQ and describes the problem of indexing. A second part proposes an effective solution for indexing very large LVQ codebooks, whatever the shape parameter p, with an indexing example. The description then specifies the memory and computing cost of the proposed approach, and indicates the performance values for effective real data indexing.

2. Indexing of Lattice Vectors 2.1 Definition of a Lattice

A lattice $\Lambda$ in $R^n$ is composed of any integral combination of a set of linearly independent vectors $a_i$ (the base of the lattice) such that:

$$\Lambda = \{x | x = u_1 a_1 + u_2 a_2 + \ldots u_n a_n\} \quad (1)$$

$$\Lambda = \{x | x = u_1 a_1 + u_2 a_2 + \ldots u_n a_n\} \quad (1)$$

Each vector v of a lattice can be considered to belong to a surface or hypersurface containing vectors having a constant norm $I_p$ given by:

$$\|v\|_p = \left(\sum_{i=1}^n |v_i|^p\right)^{\frac{1}{p}}.$$

It is then possible to code a given lattice vector using a product code. It is clear that, if the distribution of the source vectors is Laplacian, an appropriate product code consists in a prefix corresponding to the norm $I_1$ of a vector and a suffix corresponding to its position on the hyperpyramid with a radius equal to the norm $I_1$ in question. The hypersurfaces of constant norm $I_1$ are called hyperpyramids. The position of the vector on a hypersurface can be obtained using a counting algorithm. Such a product code ensures unicity for the decoding.

In the case of sources having a generalised Gaussian distribution with a shape parameter less than or equal to one, the superiority of the cubic $Z^n$ lattice on $D_4$, $E_8$ or Leech lattices has been demonstrated [12]. Consequently, the remainder of this document is focused on the design of an LVQ based on the cubic $Z^n$ lattice.

2.2 Indexing Based on Total Counting

Several counting solutions are known in the prior art that have been proposed for the case of Gaussian or Laplacian distributions and for different lattices based on the principle of total counting. A recursive formula for counting the total number of lattice vectors situated on a hyperpyramid of norm $I_1$ is in particular known in the case of a Laplacian source distribution and for a lattice $Z^n$. This counting formula has been extended to generalised Gaussian source distributions with a shape factor p of between 0 and 2. These solutions make it possible to determine the number of vectors situated within a given truncation norm $I_p$, but they do not propose an algorithm for assigning an actual index to the vectors of the lattice $Z^n$. In addition, this solution does not determine the number of vectors situated on a given hypersurface, which makes it difficult to use product codes.

The algorithm proposed in the works of the prior art indexes the vectors in accordance with the product code scheme for 0<p≤2. It is based on the generalised theta series [4] and uses the geometry of the lattice. For p=1 or 2, the development of this series is relatively simple. However, for other values of p, the development of this series is very complex, given that no closed shape is produced and the use of formal mathematics is prohibitive. With the solution proposed, it is necessary to determine each possible norm value for the various dimensions and for high dimensions, which tends to be unfeasible in a finite time. In addition, given that the cardinality of a hypersurface may rapidly reach intractable values for practical implementation, in particular for high dimensions (see table below), the indexing techniques based on the cardinality of the envelope may rapidly exceed computing precision.

2.3 Indexing Based on Leaders

The methods based on leaders take advantage of the symmetries of the lattice. They use an effective indexing algorithm on the constant norm envelopes and attribute the index not on the basis of the total number of vectors of the lattice but on the basis of a small number of vectors called leaders. The different symmetries of the lattice are treated separately, which, compared with the total counting techniques, constitutes a more effective method of indexing sources when the symmetries are not all present. In addition, the indexes managed by the coding algorithm are much smaller than the cardinality of the envelope, which makes it possible to index vectors that could not be indexed by methods based on a total counting for a given binary precision.

In the product code architecture, apart from the symmetries of the lattice, the suffix index contains the index of a small number of leaders from which all the other vectors of the hypersurface can be assigned. For the lattice $Z^n$, the symmetries correspond to two basic operations: changes in sign and permutations of the vectorial coordinates. The first operation corresponds to a change of the octant where the vector is situated. For example, the vector (7, −3) of dimension 2 is in the fourth octant, while the vector (−7, −3) is in the third. These vectors are symmetrical with respect to the y axis. The second operation corresponds to the intra-octant symmetry when, for example, the vectors (−7, 3) and (−3, 7) are both in the second octant and symmetrical with respect to the bisector of the octant. In this case, it can be observed that all these vectors can be generated from permutations and changes of sign of the vector (3, 7), which is the leader of all these vectors. With all the permutations and changes of sign, the leader (3, 7) can represent 8 vectors. This ratio increases rapidly with the dimension of the hypersurface (see Table 1).

Consequently, instead of directly indexing all the vectors on a hypersurface, this indexing method assigns to each vector a set of three indices: one corresponding to its leader and the other two corresponding to its permutation and to the changes of sign of the leader. For more details on the method of calculating the permutation and sign indices.

3. Proposed Indexing Method
3.1 Leader Indexing Proposed in the Case of Norm
3.1.1 Principle The invention proposes a solution based on classifying all the vectors in reverse lexicographical order and attributes an index according to the number of vectors preceding the leader to be indexed. In the present case, the indexing is no longer based on a search algorithm with high consumption of resources or direct addressing, but on low-cost counting algorithm that depends solely on the quantity of leaders rather than explicit knowledge of each of them, which makes it possible to avoid the construction of conversion tables.

A hyperpyramid of radius r is composed of all the vectors $v=(v_1, v_2, \ldots, v_d)$ so that $\|v\|_1=r$. As described previously, the leaders are the elementary vectors of a hypersurface from which permutation and change of sign operations lead to all the other vectors situated on this hypersurface. This is because the leaders are vectors that have positive coordinates sorted in increasing (or decreasing) order. Consequently, the leaders for the norm $l_1$ equal to r and the dimension d are vectors that satisfy the following conditions:

$$1\text{-} \sum_{i=1}^{d} v_i = r;$$

$$2\text{-} 0 \leq v_i \leq v_j, \text{ for } i < j \text{ and } i, j \in [1, d].$$

3.1.2 Link with the Theory of Partitions

In the case of a norm $l_1$, it can be noted that the conditions presented in section 3.1.1 are related to the theory of partitions in number theory. This is because, in number theory, a partition of a positive integer r is a way of writing r as being a sum of d positive integers (also referred to as a part). The number of distinct partitions (independent of the order) of r is given by the partition function P(r) so that:

$$\sum_{r=0}^{\infty} P(r) y^r = \prod_{d=1}^{\infty} \left( \frac{1}{1-y^d} \right), \quad (2)$$

which corresponds to the reciprocal of Euler's function, also referred to as series q [10, 16, 17]. Additional mathematical developments lead to representations of the function P(r) making it possible to accelerate the calculations.

For example, for r=5, equation (2) gives the result P(5)=7. This is because all the possible partitions of the number 5 are (5), (1, 4), (2, 3), (1, 1, 3), (1, 2, 2), (1, 1, 1, 2) and (1, 1, 1, 1, 1). By re-writing these partitions in the form of dimension 5 vectors such as (0, 0, 0, 0, 5), (0, 0, 0, 1, 4), (0, 0, 0, 2, 3), (0, 0, 1, 1, 3), (0, 0, 1, 2, 2), (0, 1, 1, 1, 2) and (1, 1, 1, 1, 1), we observe that these correspond exactly to the leaders of the hyperpyramid of norm r=5 and dimension d=5, that is to say these are the only vectors in the hyperpyramid of norm r=5 and dimension d=5 that satisfy the two conditions of section 3.1.1.

However, we are concerned generally with envelopes of norm $l_1$ equal to r in a d-dimensional network with r≠d. In this case, it is possible to use the function q(r, d) [10, 18] that calculates the number of partitions of r with no more than d parts (in the theory of partitions this is equivalent to calculating the number of partitions of r not comprising any element greater than d with any number of parts). Consequently, for a hyperpyramid of norm r=5 and dimension d=3, we have q(5, 3)=5, that is to say, five leaders given by:

(0, 0, 5), (0, 1, 4), (0, 2, 3), (1, 1, 3) and (1, 2, 2).

The function q(r, d) can be calculated from the recurrence equation:

$$q(r,d) = q(r,d-1) + q(r-d,d) \quad (3)$$

with $q(r,d)=P(r)$ for $d>r$, $q(1,d)=1$ and $q(r,0)=0$.

3.1.3 Use of the Function q(r, d) for Indexing the Leaders

As described below, not only does equation (3) give the total number of leaders situated on a given hyperpyramid, but it can also be used to attribute on the fly unique indices for the leaders, without requiring conversion tables. In order to illustrate the principle of the proposed algorithm, let us assume that the leaders of a given hyperpyramid are classified in reverse lexicographical order as follows:

| Index value | Leader |
|---|---|
| 0 | $(0, \ldots, 0, 0, r_n)$ |
| 1 | $(0, \ldots, 0, 1, r_n - 1)$ |
| 2 | $(0, \ldots, 0, 2, r_n - 2)$ |
| 3 | $(0, \ldots, 1, 1, r_n - 2)$ |
| . | . |
| . | . |
| . | . |

Thus, the index of a leader I corresponds to the number of vectors that precede it. In the example described above, the leader $(0, \ldots, 1, 1, r_n-2)$ must be assigned to the index 3.

Proposition 1 Defines the Solution Proposed for Indexing the Leader:

Proposition 1. Let $v=(v_1, v_2, \ldots, v_n)$ a lattice vector $Z^n$ with a leader $I=(x_1, x_2, \ldots x_n)$ situated on an envelope of constant norm $l_1$. Its leader index $I_l$ is given by:

$$I_1 = \sum_{j=0}^{n-2} \sum_{i=x_{n-j}+1}^{\min[x_{n-(j-1)}, r_{n-j}]} \overline{q}(r_{n-j} - i, n-(j+1), i) \quad (4)$$

While $x_{n-(j+1)} \neq 0$ where $\overline{q}(r, d, k)$ calculates the number of partitions of $r$ with no more than $d$ parts less than or equal to $k$, with $\overline{q}(0, d, k)=1$ and $x_{n+1}=+\infty$.

Demonstration. Let us consider a leader $I=(x_1, x_2, \ldots, x_n)$ of dimension n and norm $I_1$ $$r_n = \sum_{i=1}^{n} x_i$$

having to be indexed. Given that the leaders are sorted in reverse lexicographical order, a first set of leaders placed before I is composed of all the leaders in which the $n^{th}$ component is strictly greater than $x_n$, which is to say, all the leaders that have the highest coordinate $g_n$ satisfying $x_n+1 \leq g_n \leq r_n$. In order to count the number of leaders in this first set without listing all, we use the partition function $q(r, d)$. This is because the number of leaders in which the $n^{th}$ coordinate is equal to $g_n$ can easily be calculated using the following remark:

Remark: the calculation of the number of leaders of norm $r_n$ and dimension n in which the greatest coordinate is equal to $g_n$ amounts to calculating the number of partitions of the number $r_n - g_n$ with no more than n−1 parts without any part greater than $g_n$. In the majority of cases, we can count this number of partitions by applying $q(r_n-g_n, n-1)$. However, this approach is valid only if $r_n - g_n \leq g_n$, in which case it is implicitly assumed that all the partitions of $r_n - g_n$ have no part greater than $g_n$. However, in a more general case, in which $r_n - g_n \leq g_n$ is not guaranteed (for example, the number of leaders of norm $r_n=20$ and dimension n=5 with the greatest part equal to 7 would lead to $q(20-7, 5-1)=q(13, 4)$, where $20-7 \leq 7$), the calculation of $q(r_n - g_n, n-1)$ would lead to an erroneous number of valid leaders, given that some partitions of $r_n - g_n$ would have their greatest part superior to $g_n$, in which case condition 2 in section 3.1.1 would not be complied with.

In such a situation, we must apply a second constraint to the calculation of the number of partitions: the value of the largest part. We then use a generalisation of $\overline{q}(r, d)$, given by the function $\overline{q}(r, d, k)$, which calculates the number of partitions of a given number r with no more than d parts without any part greater than k. The calculation of $\overline{q}(r, d, k)$ is done by means of a counting algorithm.

Consequently we can calculate the correct number of valid leaders by applying $\overline{q}(r_n - g_n, n-1, g_n)$. Thus, the variation of $g_n$ from $x_n+1$ to $r_n$ makes it possible to determine the number of leaders where the greatest coordinate is strictly greater than $x_n$, given by:

$$\sum_{i=x_n+1}^{r_n} \overline{q}(r_n - i, n-1, i) \quad (5)$$

where it is assumed that $\overline{q}(0, d, k)=1$, $\forall d \in Z^+$ and $\forall k \in Z^*$. In this case, we use the set notation used in number theory, where $Z^+$ represents all the positive integers $\{i \in Z | i>0\}$ and $Z^*$ all the non-negative integers $\{i \in Z | i \geq 0\}$.

A second set of leaders preceding I is composed of all the leaders where the $n^{th}$ coordinate is equal to $X_n$ but with one $(n-1)^{th}$ coordinate strictly greater than $x_{n-1}$. In order to count this number of leaders, we can use the same remark previously mentioned, but this time applying to the dimension n−1. We can then calculate the number of leaders where the largest component $g_n=x_n$ and the second largest component $g_{n-1}>X_{n-1}$ using $\overline{q}((r_n-x_n)-g_{n-1}, (n-1)-1, g_{n-1})$ or $\overline{q}(r_{n-1}-g_{n-1}, n-2, g_{n-1})$ by varying $g_{n-1}$ from $x_{n-1}+1$ to min $(x_n, r_{n-1})$. The min function guarantees that the norm $r_n$ and the order $g_{n-1} \leq g_n = X_n$ are complied with.

While awaiting the result at the additional dimensions, the number of leaders in which the highest coordinate is equal to $x_n$, but which precede I, can be obtained by:

$$I_1 = \sum_{j=1}^{n-2} \sum_{i=x_{n-j}+1}^{\min[x_{n-(j-1)}, r_{n-j}]} \overline{q}(r_{n-j} - i, n-(j+1), i) \quad (6)$$

While $x_{n-(j+1)} \neq 0$

The combination of equations (5) and (6) leads to a general formula for calculating the total number of leaders placed before 1, and therefore the index $I_1$ of 1 (equation (4)):

$$I_1 = \sum_{j=0}^{n-2} \sum_{i=x_{n-j}+1}^{\min[x_{n-(j-1)}, r_{n-j}]} \overline{q}(r_{n-j} - i, n-(j+1), i)$$

While $x_{n-(j+1)} \neq 0$

Where $x_{n+1}=+\infty$ for j=0.

3.2 Generalisation to the Case of a Norm $1_p$

In order to calculate the index of the leader $1=(x_1, x_2, \ldots, x_n)$ of a vector $v=(v_1, v_2, \ldots, v_n)$ situated on an envelope of constant norm $1_p$, with $0<p \leq 2$, we propose applying the same principle as in the case of $I_1$. The leaders are listed in reverse lexicographical order and the indexes are attributed using the same counting approach. Consequently the structure of equation (4) is again appropriate, where the sum on i with the function $\overline{q}$ calculates the number of leaders according to a given coordinate and the sum on j allows recursion on the dimension.

However, the use of $\overline{q}$ implicitly means that the sum terms $x_i^p$ of a norm r are integers and may be any integer in the range $[0, r]$. This is obviously valid for p=1, where the sum terms are the positive integer lattice coordinates themselves. On the other hand, for $p \neq 1$, the sum terms $x_i^p$ are not necessarily integers or may not be any integer in the range $[0, r]$ (for example, for p=2 the sum terms are integers, but only the square numbers).

It is possible to solve this problem by rounding $x_i^p$ to the closest integer with a precision $\delta$. A similar technique was used in [7, 9]. This operation introduces a new subset of integers $\$_\delta^p$ composed of all the integers $\overline{x}_{i,p}$, where $$\overline{x}_i = \left[\frac{x_i^p}{\delta}\right],$$

is the closest integer and $x_i \in Z^*$.

Figure 2:
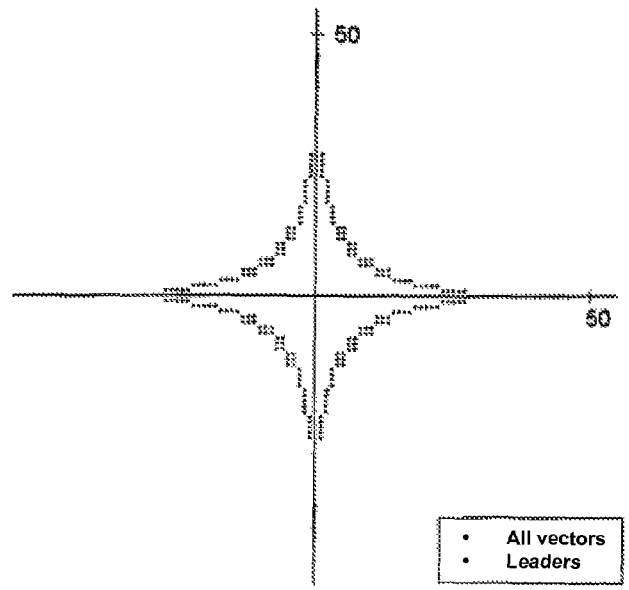
FIG. 2 shows an example of an envelope of $r^P_{\delta,2}=15$, p=0.4 and δ=0.3 for a lattice $Z^2$.

The norm $I_p$ of a vector is then known with a precision $\delta$ and is obtained by:

$$r_{\delta,n}^p = \sum_{i=1}^{n} \bar{x}_i = \sum_{i=1}^{n} \left\lceil \frac{x_i^p}{\delta} \right\rceil \quad (7)$$

where the precision δ defines the width of the envelopes of constant norm $r_{\delta,n}^P$, comprising more vectors as its value increases (see FIG. 2).

FIG. 1: example of envelope of $r_{\delta,2}^P=15$, p=0.4 and δ=0.3 for a lattice $Z^2$. Consequently the calculation of the leader index of a vector in a constant norm $I_p$ corresponds to the calculation of a correct number of partitions of an integer, but using only integers belonging to the subset $\$_\delta^P$.

Proposition 2 Describes the Solution we Propose:

Proposition 2. Let $v=(v_1, v_2, \ldots, v_n)$ be a lattice vector $Z^n$ with a leader $I=(x_1, x_2, m, x_n)$ situated on an envelope of constant norm $I_p$. Its leader index $I_1$ is given by:

$$I_1 = \sum_{\substack{j=0 \\ \text{While } x_{n-(j+1)} \neq 0}}^{n-2} \sum_{i=x_{n-j}+1}^{\min[x_{n-(j-1)}, f(r_{\delta,n-j}^P)]} \bar{q}_\delta^P(r_{\delta,n-j}^P - t(i), n-(j+1), i) + \quad (8)$$

$$\min(f(\bar{x}_1), x_2) - x_1$$

where $\$_\delta^P(r, d, k)$ calculates the number of partitions of $r \in \bar{q}_\delta^P$ with no more than d parts less than or equal to $k \in Z^*$, with $\$_\delta^P(0, d, k)=1$ and $X_{n+1}=+\infty$. f(a) returns the maximum value $i \in Z^*$ so that $t(i) \leq a$, for $$a \leq \left\lceil \frac{i^p}{\delta} \right\rceil$$

and $t(i)=\$_\delta^P$

Demonstration

Let us consider a leader $I=(x_1, x_2, \ldots x_n)$ of dimension n and norm $1_p$ $$r_n = \sum_{i=1}^{n} x_i^p$$

having to be indexed. As previously described, we propose using the same principle as equation (4). However, use of the function $\bar{q}$ is no longer possible, given that the sum terms of a norm $I_p$, with p≠1, are not always integers.

Rounding $x_i^p$ to the closest integer with a precision δ makes it possible to obtain an integer norm $r_{\delta,n}^P$ from a sum of positive integer values $\bar{x}_i$, as defined in equation (7). Consequently the index of a leader I situated on an envelope of p≠1 with a precision δ can be calculated by counting the number of different ways of writing $\bar{x}_i \in \$_\delta^P = r$ as being the sum of $\$_\delta^P$, where $\bar{x}_i \in \$_\delta^P$ is the whole of the image of the function t defined by t: $Z^* \to \$_\delta^P$ which matches $x_i \to \bar{x}_i$ where $$t(x_i) = \bar{x}_i = \left\lceil \frac{x_i^p}{\delta} \right\rceil$$

It is important here to note that, depending on the values of p and δ, the function t may represent a non-injective function, given that different values of $Z^*$ can be matched with the same value in $\$_\delta^P$. Consequently, different leaders $1 \in Z^{n*}$ can have the same representation in and any naive procedure for counting the number of partitions in would lead not only to an erroneous leader index but also to attributing the same erroneous index to distinct leaders.

We define as a solution the function $\bar{q}_\delta^P(r, d, k)$ as being the function that counts the number of partitions of $r \in \$_\delta^P$ with no more than d parts, where a part is given by $t(i) \in \$_\delta^P$, with no i greater than k, for i, $k \in Z^*$. It should be noted that the constraint on the value of the largest part in $\$_\delta^P$ using indirectly a value k of $Z^*$ makes it possible to count the number of different leaders that lead to the same partition in $\$_\delta^{Pn}$.

Consequently, using $\bar{q}_\delta^P(r, d, k)$, equation (4) can be extended for norms $I_p$ by:

$$I_1 = \sum_{\substack{j=0 \\ \text{While } x_{n-(j+1)} \neq 0}}^{n-2} \sum_{i=x_{n-j}+1}^{\min[x_{n-(j-1)}, f(r_{\delta,n-j}^P)]} \bar{q}_\delta^P(r_{\delta,n-j}^P - t(i), n-(j+1), i) \quad (9)$$

where f(a) returns the maximum value $i \in Z^*$ so that $t(i) \leq a$, for $a \leq \$_\delta^P$.

By varying j from 0 to n−2 in equation (9) the preceding number of leaders I for the coordinates $x_n$ to $x_2$ is counted correctly. In the case of the norm $I_1$, it is a sufficient condition to calculate the total number of previous leaders, given that there exists a single value $x_1 \in Z^*$ for which $$x_1 + \sum_{i=2}^{n} x_i = r_n \bullet.$$

However, for the norm $I_p$, it is possible that several values $x_1 \in Z^*$ lead to $$\vec{x}_1 + \sum_{i=2}^{n} \bar{x}_i = r_{\delta,n}^p$$

because of the non-injection of the function t. Consequently, in order to guarantee unicity of the index, the difference between $\min(f(x_1), x_2)$ and $x_1$ is calculated and this is added to the result of equation (9), in order to obtain the unique decodable leader index given by equation (8):

$$I_1 = \sum_{\substack{j=0 \\ \text{While } x_{n-(j+1)} \neq 0}}^{n-2} \sum_{i=x_{n-j}+1}^{\min[x_{n-(j-1)}, f(r_{\delta,n-j}^P)]} \bar{q}_\delta^P(r_{\delta,n-j}^P - t(i), n-(j+1), i) +$$

$$\min(f(\bar{x}_1), x_2) - x_1$$

The min function is required given that $f(\bar{x}_1)$ may be greater than $x_2$ (see the example in section 4) whereas $x_1$ may be smaller than or equal to $x_2$. The calculation of $\bar{q}_\delta^P(r, d, k)$ is done by means of a counting algorithm.

3.3 Decoding a Leader Index

Let us consider that the index I of the leader $I=(x_1, x_2, \ldots, x_n)$ and the index of its norm $I_p$ $r_{\delta,n}^P$ are send to the decoder. Furthermore, let us assume that the vector dimension n, the shape factor p and the precision δ used in the coding step are known by the decoder. The goal here is to extract the correct values of $x_i$, $\forall i \in [1, n]$, using only this information. As in the coding step, we will start with processing the $n^{th}$ coordinate $x_n$.

In the decoder, with the information relating to the norm and the dimension, we can clearly observe that $x_n \in [imin(r_{\delta,n}^P, n) \; f(r_{\delta,n}^P)]$ (see equations (8) and (10)). Furthermore, given that $I_1$ is the number of vectors preceding 1, the number of vectors with the highest coordinate $g_n \geq x_n$ is higher than $I_1$. This means that $x_n$ is the first value of $i \in \{f(r_{\delta,n}^P), f(r_{\delta,n}^P)-1, f(r_{\delta,n}^P)-2, imin(r_{\delta,n}^P \; r \; n)\}$ for which the number of vectors with the highest component $g_n \geq i$ is higher than $I_l$.

Consequently, in order to extract $x_n$, the number of vectors with the highest component varying from $f(r_{\delta,n}^P)$ to zero is counted until obtaining a total number of vectors that is higher than $I_1$. Using the principle introduced in section 3.1, this is equivalent to calculating the number of partitions N as being:

$$N_p = \sum_{\substack{i=f(r_{\delta,n}^p) \\ \text{While } N_p \leq I_1}}^{0} \bar{q}_\delta^p(r_{\delta,n}^p - t(i), n-1, i) \quad (11)$$

and attributing to $x_n$ the first value of i for which $N_p > I_1$.

In the following step, we decode $x_{n-1}$. By applying a principle identical to that used to decode $x_n$, we observe that $x_{n-1} \in [imin(r_{\delta,n-1}^P, n-1), \min[x_n, f(r_{\delta,n-1}^P)]]$ (see equations (8) and (10)). Given that $r_{\delta,n-1}^P$ is known in the decoder and that $x_n$ has been decoded, $r_{\delta,n-1}^P = r_{\delta,n}^P - t(x_n)$ can be obtained by calculating $r_{\delta,n-1}^P$.

Next, to decode $X_{n-1}$, we count Np using a mechanism similar to that of equation (11), but this time in relation to the $(n-1)^{th}$ coordinate. In this case, given that $N_p > I_1$, we must, in a first step, point the counter of the partition $N_p$ back to the first leader with the $n^{th}$ component equal to $x_n$, by parameterising $N_p$ to its preceding value, hereinafter referred to as $N_{pbckp}$ (the "preceding value" corresponds to the highest value of $N_p$ such that $N_p \leq I_1$, in other words, the value of $N_p$ before the last value of i is included in the sum). The preceding value designates the highest value of $N_p$ for which $N_p \leq I_1$, in other words, the value of $N_p$ before the last value of i is included in the sum). The preceding value designates the highest value of $N_p$ for which $N_p \leq I_1$, in other words, the value of $N_p$ before including the last value of i in the sum. Consequently, we attribute to $x_{n-1}$ the first value of $i \in \{\min[x_n, f(r_{\delta,n-1}^P)], \min[x_n, f(r_{\delta,n-1}^P))]-1, imin(r_{\delta,n-1}^P, n-1)\}$ for which the number of vectors with the highest coordinate $g_n = x_n$ and the second highest coordinate $g_{n-1} \geq i$ is higher than $I_1 - N_{pbckp}$.

This process can be generalised in the dimension $$N_p^{(j)} = N_{pbckp}^{(j-1)} + \sum_{\substack{i=\min[x_{n-(j-1)},f(r_{\delta,n-j}^p)] \\ \text{While } N_p^{(j)} \leq I_1}}^{0} \bar{q}_\delta^p(r_{\delta,n-j}^p - t(i), n-(j+1), i) \quad (12)$$

where $\bar{q}_\delta^p = 0$ for $j=0$, $x_{n+1}(0, d, k) = 1$ and $\bar{q}_\delta^p = +\infty$. By varying j from 0 to n−2 we can decode the coordinates $x_n$ to $x_2$ of the leader I.

Once the coordinate $x_2$ has been decoded, $r_{\delta,1}^P$ can be obtained by calculating $r_{\delta,1}^P = r_{\delta,2}^P - t(x_2)$. However, as described previously, a plurality of values of $x_i \in Z^*$ can be matched in $r_{\delta,1}^P \in \$_\delta^P$ (using the equation (7), we can deduce that $r_{\delta,1}^P = \bar{x}_1$). To obtain the solution, we introduce the difference $\min(f(r_{\delta,1}^P), x_2) - x_l$ on the coder such that the coordinate $x_l$ can be decoded in a unique manner by calculating $x_l = \min(f(r_{\delta,1}^P), x_2) - (I_1 - N_{pbckp}^{(n-2)})$. Indeed, it should be noted that $N_{pbckp}^{(n-2)}$ (the preceding value of $N_p$ obtained after decoding $x_2$) is equal to the value calculated using the equation (9) (the value of $I_1$ before adding the difference), given that the two are the result of strictly identical criteria.

Consequently, the leader $I = (x_1, x_2, \ldots, x_n)$ is decoded using only the information $I_1$, $r_{\delta,1}^P$, n, p and 8. The following section describes an example of coding and decoding a leader.

4. Example of Coding and Decoding

Let $v = (-20, 16, 15, -40)$ a quantised lattice vector of a source having generalised Gaussian distribution with a shape factor $p=0.3$ which should be indexed. Given that the calculation of the permutation and sign indices is not included in the scope of this work, and can be easily performed using [5, 13], here we will focus on indexing the leader. The leader corresponding to the vector v is $I = (15, 16, 20, 40)$. The coding and decoding algorithms are based on the following principles.

Coding Step:

1) Initialisation: let $p=0.3$ and the precision $\delta=0.1$. Let the leader index $I_1=0$;

2) Calculate the norm $I_p$ of the leader I with a precision $\delta$ as $$r_{\delta,4}^p = \sum_{i=1}^{4}\left[\frac{x_i^{0.3}}{0.1}\right] = 10;$$

3) perform these operations; we will start by determining $f(101)$. In this case, $f(101)=2264$. Next, using the equation (8) for $j=0$ and i ranging from 41 (i.e. 40+1) to 2264 (i.e. $\min(+\infty, 2264)$) leads to:

$$I_1 = 0 + \sum_{i=41}^{2264} \bar{q}_{0.1}^{0.3}\left(101 - \left[\frac{i^{0.3}}{0.1}\right], 3, i\right) 10032;$$

4) Calculate the preceding number of leaders I, but with the highest component $g_4$ equal to 40. This means that we must add $$r_{\delta,3}^p = \sum_{i=1}^{3}\left[\frac{x_i^{0.3}}{0.1}\right] = 71$$

in 3 parts.

The use of the equations (8) with $f(71)=704$, $j=1$ and i ranging from 21 to 40 (i.e. $\min(40, 704)$) leads to:

$$I_1 = 10032 + 1\sum_{i=21}^{40} \bar{q}_{0.1}^{0.3}\left(71 - \left[\frac{i^{0.3}}{0.1}\right], 2, i\right) = 10076;$$

5) Calculate the preceding number of leaders I with the highest component $g_4=40$ and $g_3=20$. In this case, we must add $$r_{\delta,2}^{p} = \sum_{i=1}^{2} \left[ \frac{x_i^{0.3}}{Q1} \right] = 46,$$

in 2 parts. The use of the equations (8) with f(46)=167, j=2 and i ranging from 17 to 20 (i.e. min(20, 167)) leads to:

$$I_1 = 10076 + 5 \sum_{i=17}^{20} \bar{q}_{01}^{0.3}\left(46 - \left[\frac{i^{0.3}}{0.1}\right], 1, i\right) = 10077;$$

6) In the last step, update $I_1$ by calculating (see the equation (8)):

$$\begin{aligned}I_1 &= 100774 + (\min(f(x)), x_2) - x_l) \\ &= 100774 + (\min(f(23), 16) - 15) \\ &= 100774 + (\min(17, 16) - 15) \\ &= 100775.\end{aligned}$$

Consequently, the index of the leader I=(15, 16, 20, 40) for p=0.3 and δ=0.1 is $I_1$=100775. The algorithm 1 in the appendix compiles the entire coding process.

Decoding Step:
1) Initialisation: let $r_{\delta,n}^{p}$=101, $I_1$=100775, p=0.3, δ=0.1 and n=4;
2) Calculate f(101)=2264;
3) Decode $x_4$. In this case, we will use the equation (12) with j=0 to obtain:

$$N_p^{(0)} = 0 + \sum_{\substack{i=\min[+x,2264] \\ \text{While } N_p^{(0)} \leq i_1}}^{0} \bar{q}_{01}^{03}\left(101 - \left[\frac{i^{0.3}}{0.1}\right], 3, i\right).$$

By changing i from 2264 to 41 we obtain $N_p^{(0)}$=100321<100775. However, by including i=40 in the results of adding on $N_p^{(0)}$=100321 we obtain $N_p$=100786, which is strictly higher than I. Given that 100321<100775<100786, we define the coordinate $x_4$ as i=40 and the leader obtained is I=($x_1$, $x_2$, $x_3$, 40). Moreover, we define=100321.
4) Decode $x_3$. Given that $x_4$=40, we find that $$r_{\delta,3}^{p} = 101 - \left[\frac{40^{0.3}}{0.1}\right] = 71,$$

where f(71)=704. Next, we calculate $N_p^{(1)}$.

$$N_p^{(1)} = 10032 + 1 \sum_{\substack{i=\min[40,704] \\ \text{While } N_p^{(1)} \leq i_1}}^{0} \bar{q}_{01}^{03}\left(71 - \left[\frac{i^{0.3}}{0.1}\right], 2, i\right)$$

For i=21, we obtain $N_p^{(1)}$=100765<100775 and for i=20, $N_p^{(1)}$=100777>100775. Consequently, $x_3$ is defined as 20 and therefore I=($x_1$, $x_2$, 20, 40). In this case, $N_{pbckp}^{(1)}$=100765.

5) Decode $x_2$. Given that $x_3$=20, we find that $$r_{\delta,2}^{p} = 71 - \left[\frac{20^{0.3}}{0.1}\right] = 46,$$

where f(46)=167. Next, we calculate $N_p^{(2)}$:

$$N_p^{(2)} = 10076 + 5 \sum_{\substack{i=\min[20,167] \\ \text{While } N_p^{(2)} \leq i_1}}^{0} \bar{q}_{01}^{03}\left(46 - \left[\frac{i^{0.3}}{0.1}\right], 1, i\right).$$

the last step, decoding $x_1$. Given that $x_2$=16, we find that $$r_{\delta,1}^{p} = 46 - \left[\frac{16^{0.3}}{0.1}\right] = 23.$$

Finally, we calculate $x_1$.

$$\begin{aligned}x_1 &= \min(f(r_{\delta,1}^{p}), x_2) - (I_1 - N_{pbckp}^{(n-2)}) \\ &= \min(f(23), 16) - (100775 - 100774) \\ &= \min(17, 16) - (100775 - 100774) \\ &= 15.\end{aligned}$$

Consequently, we obtain 1=(15, 16, 20, 40). Algorithm 2 in the appendix compiles the entire decoding process.

5. Memory and Computing Cost 5.1 Memory Requirements

In the case where $\bar{q}_\delta^{p}$ (r, d, k) is not calculated on line, the memory requirements can be calculated as described below. The $\bar{q}_\delta^{p}$ stored, regardless of the counting algorithm used, can be interpreted as being a three-dimensional table, where the first input is the value r ∈ $\$_\delta^{p}$, the second is the dimension d ∈ Z+ and the third is the maximum lattice value k ∈ Z*. The maximum memory requirement provided is then r·d·k·B bytes, where B is the number of bytes per element of $\bar{q}_\delta^{p}$.

However, the limit for the effective coding and decoding steps for a given maximum norm $r_{\delta,n}^{p}$=r and a dimension d is lower. This is because, from equations (8), (10) and (12), it can be observed that the largest value of the first two input variables of $\bar{q}_\delta^{p}$ is obtained when j=0 and i=min(r, d). In this case, we calculate $\bar{q}_\delta^{p}$(r-t(imin(r, d), d-1, $$imin(r, d)) = q_\delta^{p}\left(r - \left[\frac{r}{d}\right], d - 1.$$

Consequently it suffices to use the first input variable (related to the norm) over the range $$\left[0, r - \left[\frac{r}{d}\right]\right]$$

and the second (related to the dimension) over the range [1, d−1]. The value of k can be determined from r. Given that the second constraint is required only if $$t(k) \le \frac{r}{2},$$

the maximum value of k can be defined at $$k = f\left(\frac{r}{2}\right)$$

in order to index any leader having a norm in the range [0, r] and a dimension [1, d]. Consequently, the upper limit of memory cost for the coding and decoding steps is given by:

$$\#M = \left(\left(r - \left[\frac{r}{d}\right]\right) + 1\right) \times (d-1) \times \left(f\left(\left[\frac{r}{2}\right]\right) + 1\right) \cdot B \text{ octets} \quad (13)$$

It should be noted that the memory requirement depends mainly on the norm and the dimension of the envelopes. The number of leaders determines the choice of B.

Figure 3:
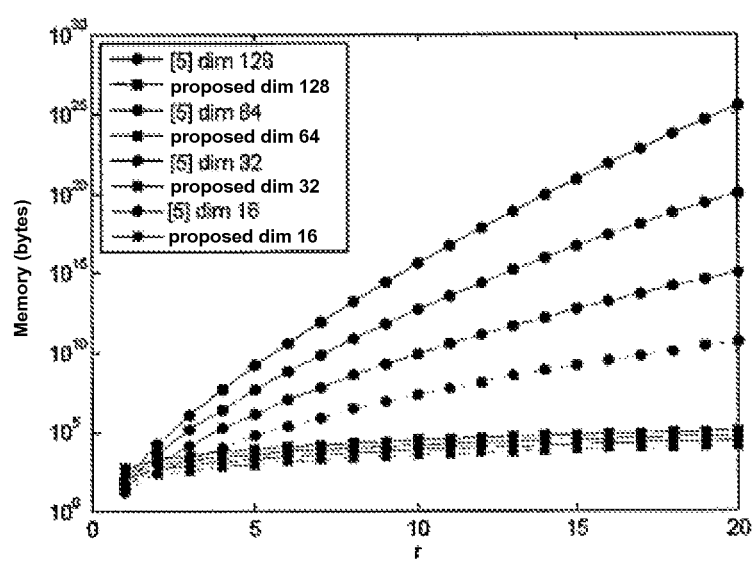
FIG. 3 shows a comparison between the memory requirements of the usual method and the method proposed for p=1, δ=1 and B=4; and Appendix 1 shows an example of coding and decoding algorithms for implementing the invention.

FIG. 3 illustrates the memory saving using the indexing algorithm, with the table $\overline{q}_\delta^p$ calculated offline. The memory requirement is represented from equation (13) according to the radius r for p 1, $\delta$=1 and B=4 (that is to say, data of the integer type) and is compared with the upper memory limit of the convention methods based on leaders as described in [5]. It should be noted that, even for a dimension and a radius as low as 16 and 20 respectively, the conventional methods require no more than 10 gigabytes of memory while the method proposed requires less than 100 kilobytes.

The extremely small memory requirements and the fact that it is not necessary to know all the leaders makes it possible to index the lattice vectors in dimensions as high as 64, 128, 256, 512, etc. In the prior works, the practical applications were limited to a dimension of 16.

5.2 Computing Cost

The cost of computing leader index coding/decoding algorithms is assessed in this section. In this case, we ignore the cost of constructing the table $\overline{q}_\delta^p$ (r, d, k) and the vectors f(i) and t(i), given that this is carried out offline and one time only. The computing cost designates the number of operations per leader with norm $r_{\delta,n}^p$=r and dimension d. Using equations (8) and algorithms (1) and (2) (see the appendix), it can be deduced that the only operations required are additions/subtractions (A) and logical comparison operations (LC). We ignore memory access since it is much less costly that these two types of operations.

The cost of coding/decoding the proposed indexing algorithm is assessed below. The decoding algorithm 2 is essentially the reverse of the coding algorithm 1 and comprises approximately the same number of operations. The complexity of the coding and decoding algorithms is assessed by counting the number of operations in algorithm 1 as follows:

1) The total sum implemented (n−1)A
2) The first "for" (on "j") is performed approximately nnz(1) times, due to the "if/break" test, where nnz(1) designates the number of non-zero values of 1.
3) For every loop of the first "for" we have:
i. 1A and 7LC due to the first "if"
ii. 1LC due to the function "min"
iii. 3A and 1 LC per loop of the "for" on "i", which takes place min $(x_{j+1}, f(r_{\delta,j}^p))-x_i$ times 4) With the last "if" and the next line we count 2A and 2LC Consequently, the total cost of the coding/decoding algorithms in terms of additions, logic operations or comparisons is provided by:

$$\#C = \left((n+1) + nnz(1) + 3 \cdot \sum_{j=n}^{max}(\min - x_j)\right)A + \quad (14)$$

$$\left(2 + 8 \cdot nnz(1) + \sum_{j=n}^{max}(\min - x_j)\right)LC$$

where nz(I) is the number of zero elements of the leader I and min=min($x_{j+1}$, f($r_{\delta,j}^p$)) and max=max(nz(I)+1,2).

According to the invention, indexing a lattice vector is reduced to indexing the corresponding leader thereof as well as permutations and sign changes. We propose a solution for indexing the vectors without requiring any conversion table, which makes it possible to reduce memory use and the complexity of generating all the leaders. Furthermore, this solution works equally well for generalised Gaussian distribution sources with a shape parameter 0<p≤2. The proposed method is analytical and allows the use of high vector dimensions.

---

ALGORITHM 1

/* Algorithm for coding the leader index belonging to a surface with shape factor p with a precision $\delta$ and a dimension n*/
CumTotal = cumsum(1, p, $\delta$); //[a]
$I_1$ = 0;
maximum = +∞;
for(j=n−1;j>=1;j−−) // Equivalent to the first sum // of Equation (8)
{
  if(((p==1) && (1[j−1]==0)) ||[b]
  ((P!=1) && (I[j]==0)))
  break;
  else
  {
  r = CumTotal[j];
  for(i=min(maximum,f[r]);i>1[j];i−−)
  {// Second sum of Equation (8)
  rmd = r−t[i];
  if(t[i]>rmd)// No second constraint
    $I_1$+= $\overline{q}_\delta^P$ [rmd] [j−1] [0];
  else
    $I_1$ += qa [rmd][j−1][i]; }
  }
  maximum = 1[j];
}
if(j==0)
  $I_1$ += min(f[CumTotal[0]],1[1]) − 1[0];
return $I_1$;// The function ends here /*[a] The function cumsum(1, p, $\delta$) calculates the total sum of the leader I = ($x_1, x_2, ..., x_n$) in the domain $S_\delta^p$ and returns a vector v = (t[$x_1$],t[$x_1$]+t[$x_2$],..., t[x1]+t[x2]+...+t[xn]).
[b] For p = 1 it is assumed that $\delta$ = 1.
The table $\overline{q}_\delta^P$ [r][d][k] and the vectors f and t are created offline by counting algorithms.*/

---

ALGORITHM 2

/* Algorithm for decoding a leader I belonging to a surface with
norm $r_{\delta,n}^P$ = r, shape factor p and precision $\delta$, dimension d = n and index $I_1$*/
1 = $O_n$; // Vector of zeros of dimension n maximum = +∞;
$N_p$ = 0;
for(j=n−1;j>=1;j−−) // Equivalent to varying j from 0 to n − 2
{ // in Equation (12)
  i = min(maximum,f[r]);
  while ($N_p$<=$I_1$)
  {
  $N_{pbckp}$ = $N_p$;
  rmd = r−t[i];

-continued

ALGORITHM 2

```
    if(t[i]>rmd)// No second constraint
        N_p += q̄_δ^P [rmd] [j−1] [0];
    else
        N_p += q̄_δ^P [rmd ] [j −1] [i];
    i−−;
    }
    i++;
    1[j] = i;
    N_p = ^Npbckp;
    maximum = i;
        r −= t[i];
        if(r==0)
        break;
    }
if(j==0)
1[0] = min(f[r],1[1])−(I_1−N_p);
return I;// The function ends here
```

The invention claimed is:

1. A method for processing digital data comprising a quantisation step of calculating in a dimension space d at least one leader index $I_1$ for at least one part of the vectors 1, the vectors 1 constituting descriptors of input data, the leader index $I_1$ corresponding to the number of vectors that precede the leader 1 in reverse lexicographical order without the step of determining all the leaders, wherein the step of calculating the leader index $I_1$ comprises one step of calculating selected from the group consisting of:

step of calculating the norm $r_{\delta,d}^P$ of the said leader 1 $(x_1, x_2, \ldots x_d)$, where $x_1$ to $x_d$ are sorted in increasing order, and recursive counting steps on the coordinates $x_i$ with the value of i ranging from d to 1, the said counting steps consisting in counting the vectors in which the coordinate $x_i$ is comprised between $x_i+1$ and MIN $(x_{i+1}, F(r_{\delta,i}^P))$, the index $I_1$ being equal to the sum of the results of the counting steps plus the difference between min $(F(T(x_1)), x_2)$ and $x_1$, wherein $T(x_i)$ is a function returning the result of dividing the coordinate $x_i$ raised to the power p by a precision factor delta, the result of the said division being rounded to the nearest integer, and F(A) is a function that returns an integer value w in which the value T(w) is lower than or equal to the argument A of the said function F;

step of calculating the norm $r_{\delta,d}^P$ of the said leader 1 $(x_1, x_2, \ldots x_d)$, where x to $x_d$ are sorted in decreasing order, and recursive counting steps on the coordinates $x_i$ with the value of i ranging from 1 to d, the said counting steps consisting in counting the vectors in which the coordinate $x_i$ is comprised between $x_i+1$ and MIN $(x_{i−1}, F(r_{\delta,i}^P))$, the index $I_1$ being equal to the sum of the results of the counting steps plus the difference between min $(F(T(x_\delta)), x_{d−1})$ and $x_d$, wherein $T(x_i)$ is a function returning the result of dividing the coordinate $x_i$ raised to the power p by a precision factor delta, the result of the said division being rounded to the nearest integer, and F(A) is a function that returns an integer value w in which the value T(w) is lower than or equal to the argument A of the said function F.

2. The processing method according to claim 1, wherein said method does not include any steps of determining vectors other than the leader 1 currently being calculated.

3. The processing method according to claim 1, wherein the compression of vector data comprises recording the result of binary coding of the index $I_1$ as well as at least a sign index $I_s$, a norm index $I_n$ and a permutation index $I_p$.

4. The processing method according to claim 3, wherein the vector data are selected from the group consisting of:
   digital images;
   digital video sequences;
   digital audio data;
   digital three-dimensional objects;
   digital animated three-dimensional objects;
   coefficients from a transformation; and
   information stored in a database.

5. The processing method according to claim 1, further comprising searching in a vector database including calculating for reference information an index $I_{n,ref}$ as well as at least one sign index $I_{s,ref}$, a norm index $I_{n,ref}$ and a permutation index $I_{p,ref}$ and in searching for the data associated with the same indices.

6. The processing method according to claim 5, wherein the vector data are selected from the group consisting of:
   digital images;
   digital video sequences;
   digital audio data;
   digital three-dimensional objects;
   digital animated three-dimensional objects;
   objects in a text database; and
   coefficients from a transformation.

7. A method for reconstructing a digital datum according to the leader index $I_1$ calculated using a method according to claim 1, further comprising calculating the coordinates $(x_1, x_2, \ldots x_d)$ of a leader 1, applying to an index $I_1$ a treatment which involves finding the leader 1 with the index $I_1$ which corresponds to the same number of vectors preceding the leader 1 in reverse lexicographical order without a step of determining all the leaders.

8. The method for reconstructing a digital datum according to claim 7, further comprising performing a recursive treatment on the variable i ranging from d to 1, the treatment being applied to the coordinate $x_i$ with $x_i$ ranging from MIN $(x_{i+1}, F(r_{\delta,i}^P))$ to 0 and consisting in adding the results of the counting steps by means of applying the function F(A), until the sum is greater than the index the sought coordinate $x_i$ being that which leads to the index $I_1$ being surpassed, the method then comprising continuing, for the coordinate $X_{i−1}$, the sum from the value $I_1$, in which $I_1$ is the value preceding the value $I_1$ prior to surpassing the index.

9. The method for reconstructing a digital datum according to claim 7, further comprising performing a recursive treatment on the variable i ranging from 1 to d, the treatment being applied to the coordinate $x_i$ with $x_i$ ranging from MIN $(x_{i+1}$ MIN $(x_{i−1}, F(r_{\delta,i}^P))$ to 0 and including adding the results of the counting steps by means of applying the function F(A), until the sum is greater than the index $I_1$, the sought coordinate $x_i$ being that which leads to the index $I_1$ being surpassed, the method then comprising continuing, for the coordinate $X_{i+1}$, the sum from the value $I_1$, in which $I_1$ is the value preceding the value $I_1$ prior to surpassing the index.

10. The processing method according to claim 1, further comprising a computer including computing memory, the computer processing the data which is audiovisual data.

* * * * *